United States Patent [19]

Kitamura et al.

[11] Patent Number: 4,980,021

[45] Date of Patent: Dec. 25, 1990

[54] METHOD FOR PREPARATION OF EDGED MEDICAL TOOL

[75] Inventors: Hajime Kitamura, Chiba; Tamaki Iida, Tokyo, both of Japan

[73] Assignee: Shin-Etsu Chemical Co. Ltd., Tokyo, Japan

[21] Appl. No.: 343,546

[22] Filed: Apr. 21, 1989

[30] Foreign Application Priority Data

Apr. 3, 1989 [JP] Japan .................................. 1-84341

[51] Int. Cl.$^5$ .................. B44C 1/22; C03C 15/00; C03C 25/06
[52] U.S. Cl. ..................... 156/643; 30/346; 156/646; 156/655; 252/79.1; 427/38; 606/167
[58] Field of Search .................. 606/45, 167; 427/38, 427/39, 377; 156/643, 646, 655, 662, 667; 252/79.1; 30/346, 346.56

[56] References Cited

U.S. PATENT DOCUMENTS

| | | | |
|---|---|---|---|
| 3,791,852 | 2/1974 | Bunshah | 427/249 X |
| 4,416,912 | 11/1983 | Bache | 427/50 X |
| 4,504,519 | 3/1985 | Zelez | 423/445 X |
| 4,534,827 | 8/1985 | Henderson | 156/647 |
| 4,629,373 | 12/1986 | Hall | 407/118 |
| 4,839,195 | 6/1989 | Kitamura et al. | 427/38 |

*Primary Examiner*—William A. Powell
*Attorney, Agent, or Firm*—Wenderoth, Lind & Ponack

[57] ABSTRACT

An edged medical tool, such as scalpels and injection needles, is imparted with unexpectedly improved incisiveness by first providing a carbonaceous coating layer of 1 to 20 nm thickness having a crystalline structure of diamond by a method of plasma-induced vapor-phase deposition in an atmosphere of a mixture of hydrogen gas and a hydrocarbon gas at a microwave frequency of 1 to 10 GHz and then etching the thus formed diamond-like coating layer in a plasma of hydrogen gas to such an extent that the thus etched surface has a roughness of 0.5 to 5 nm.

4 Claims, No Drawings

METHOD FOR PREPARATION OF EDGED MEDICAL TOOL

BACKGROUND OF THE INVENTION

The present invention relates to an improved edged medical tool, such as injection needles, knives, scalpels, scissors, chisels and the like, used in medical and dental treatments and surgical operations for therapeutic, preventive and examination purposes, and a method for the preparation of such an improved edged medical tool.

The above mentioned edged medical tools are used for incising or cutting a living body tissue or for injecting a liquid medicament into or taking a body fluid from a living body so that it is essentially important that the edge of the tool can be thrusted into the living body tissue with a frictional resistance as small as possible. Further, it is important that the surface of the tool in contact with the living body tissue is not responsible for accelerated coagulation of blood and is stable against and insusceptible to the corrosive influence of the body fluids even when the tool is prolongedly kept in contact with the living body tissue. Needless to say, the edge of the tool should be as sharp and incisive as possible like other edged tools in general.

Conventionally, these edged medical tools are manufactured of a ceramic material or a metal optionally coated with a ceramic. The edged medical tools prepared from these prior art materials are not quite satisfactory in respect of the high frictional resistance in thrusting into living body tissues and acceleration of blood coagulation. Accordingly, it is eagerly desired in the medical and dental art to develop an edged tool free from the above mentioned problems in the conventional edged tools and satisfying the above mentioned requirements.

One of the inventors previously disclosed in Japanese Patent Kokai No. 61-210179 that the performance of a microtome blade such as incisiveness could be remarkably improved by forming a coating layer of silicon carbide on the surface of a substrate blade by the plasma-induced vapor-phase deposition method. Such a method of coating with silicon carbide, however, is not quite effective when a substantial improvement is desired of an edged medical tool. Further, it is disclosed in Japanese Patent Kokai No. 63-92345 that a substantial improvement can be obtained in the performance of an edged medical tool when the surface of the edged tool is provided with a carbonaceous coating layer of a diamond-like crystalline structure having a thickness of 1 to 20 nm which is deposited by the plasma-induced vapor-phase deposition in an atmosphere of a gaseous mixture of hydrogen and a hydrocarbon compound such as methane. The diamond-coated edged medical tool, however, is still not quite satisfactory when the tool is used in a very exquisite technique of so-called microsurgery applied to an extremely minute portion of a living body in respect of the damage to the living cells.

SUMMARY OF THE INVENTION

In view of the above described problems in the edged medical tools of the prior art, the inventors have further continued extensive investigations on a way to improve the performance of the diamond-coated medical tool, and arrived at an unexpected discovery on the basis of which the present invention has been completed.

Thus, the present invention provides a novel method for the preparation of an improved edged medical tool, which method comprises the steps of:

(a) exposing a base body of an edged medical tool to an atmosphere of a plasma generated in a gaseous mixture composed of hydrogen gas and a hydrocarbon gas by applying a high-frequency electric power at a frequency in the range from 1 GHz to 10 GHz to deposit a carbonaceous coating layer having an at least partially crystalline structure of diamond and a thickness in the range from 1 nm to 20 nm on the surface of the base body of the edged medical tool in a plasma-induced vapor-phase deposition process; and (b) exposing the coated base body of the edged medical tool to an atmosphere of a plasma generated in hydrogen gas by applying a high-frequency electric power at a frequency of 1 MHz or higher to effect etching of the surface of the at least partially crystalline carbonaceous coating layer to such an extent that the surface has a surface roughness in the range from 0.5 nm to 5 nm or, preferably, in the range from 1 nm to 3 nm.

As is understood from the above given description of the inventive method, the edged medical tool of the invention has a structure of a base body of the tool and a carbonaceous coating layer thereon having a thickness of 1 nm to 20 nm and an at least partially crystalline structure of diamond, the surface of the coating layer being roughened to have a roughness in the range from 0.5 nm to 5 nm or, preferably, in the range from 1 nm to 3 nm.

DETAILED DESCRIPTION OF THE PREFERRED EMBODIMENTS

The material of the base body of the inventive edged medical tool is not particularly limited and any material used in conventional edged medical tools can be used including metals, e.g., stainless steels, corundum, e.g., rubys and sapphires, tungsten carbide and the like. The base body may have a configuration of a conventional edged medical tool according to desire without particular limitations but should be well sharpened prior to the plasma treatment.

The first step for the preparation of the inventive edged medical tool is formation of a carbonaceous coating layer thereon having an at least partially crystalline structure of diamond by the method of plasma-induced vapor-phase deposition. The plasma treatment is performed by exposing the base body to a plasma atmosphere generated in a gaseous mixture of hydrogen gas and a hydrocarbon gas such as methane, ethane, propane, ethylene and the like. The gaseous mixture may optionally be diluted with an inert gas as a carrier such as helium, argon and the like. The mixing ratio by volume of the hydrocarbon gas (A) to the hydrogen gas (B), i.e. (A):(B), can be varied in a wide range from 500 to 0.001. When an inert gas is used as a carrier gas (C), the volume of the inert gas should satisfy the relatioship of (A):[(B)+(C)]=500 to 0.001 and the volume of the inert gas should be equal to or smaller than the volume of the hydrogen gas. The pressure of the gaseous atmosphere is controlled in the range from 5 Pa to 50 kPa in order to ensure stability of the plasma discharge.

The method for generating plasma in the above described atmosphere is well known in the art. It is preferable in the invention that the plasma is generated by applying a high frequency electric power at a frequency of 1 GHz or higher or, preferably, in the range from 1 GHz to 10 GHz.

In practicing the plasma treatment, a base body of the edged medical tool is set in a plasma chamber and the pressure of the atmosphere inside the plasma chamber is controlled at the above mentioned reduced pressure by continuously introducing a gaseous mixture of a hydrocarbon gas, hydrogen gas and, optionally, inert gas under continuous evacuation. Then, a high-frequency electric power is supplied to the electrodes of the plasma chamber so that plasma is generated in the chamber. It is important that the temperature of the base body under exposure to the plasma is controlled in the range from 500° to 1300° C. When the temperature of the base body is lower than 500° C., hydrogen gas is sometimes included in the deposited carbonaceous coating layer. When the temperature exceeds 1300° C., on the other hand, reverse transition in the crystalline structure possibly takes place in the deposited carbonaceous coating layer from the structure of diamond to that of graphite.

When the base body is exposed to the atmosphere of plasma in the above described manner, a carbonaceous coating layer is deposited on the surface thereof as a consequence of the pyrolysis of the hydrocarbon gas in the plasma flame. The thus deposited carbonaceous coating layer has a crystalline structure of diamond or a composite crystalline structure of diamond and graphite. The plasma treatment is continued until the deposited coating layer has a thickness in the range from 1 nm to 20 nm or, preferably, from 5 to 15 nm. The reliability of coating would be poor when the thickness of the coating layer is smaller than 1 nm, while the frictional resistance beteween the tool surface and the living body tissue into which the tool is thrusted may be increased to give an increased damage and pain to the patient when the thickness of the coating layer is too large. It is sometimes advantageous that the thickness of the coating layer is smallest at the very edge of the edged tool, increasing as the distance from the very edge increases.

The next step of the inventive method is the plasma-etching treatment of the carbonaceous coating layer deposited on the surface of the base body in the above described process of plasma-induced vapor-phase deposition, so that the coating layer may have a surface roughness in the range from 0.5 nm to 5 nm. This plasmaetching treatment is performed by exposing the coated base body of the edged tool to a plasma generated in an atmosphere of hydrogen gas, preferably, by applying a high-frequency electric power at a frequency of 1 MHz or higher or, preferably, in the range from 5 MHz to 100 MHz. The atmospheric gas for the plasma generation is preferably pure hydrogen gas although intermixing of a small volume of water vapor, oxygen and the like may have no particularly adverse influences. The pressure of the hydrogen plasma atmosphere was kept in the range from 5 to 20 Pa and the substrate was kept at a temperature in the range from 20° to 50° C. The plasma-etching treatment is continued until the surface has a surface roughness in the range from 0.5 nm to 5 nm or, preferably, in the range from 1 nm to 3 nm.

It is a quite unexpected discovery that the frictional resistance between the diamond-coated edged medical tool and the living body tissue into which the edged tool is thrusted is remarkably decreased when the surface of the tool has been roughened to have a roughness of 0.5 nm to 5 nm by the plasma-etching treatment in an atmosphere of hydrogen gas.

In the following, the edged medical tool of the invention and the inventive method for the preparation thereof are described in more detail by way of examples, which should not be construed to limit the scope of the invention in any way.

EXAMPLE 1

A tungsten carbide base body of a sharpened scalpel, after successive washing with water and isopropyl alcohol and drying, was mounted on a mounting table in a plasma chamber equipped with a plunger and a waveguide opening in such a disposition that the edge of the scalpel was just facing the stream of the plasma gas inside the chamber. After closing the chamber, the chamber was evacuated to have a pressure of about 5 Pa and then a 5:95 by volume mixture of methane and hydrogen was introduced into the chamber at a controlled rate with concurrent evacuation so that the pressure inside the chamber was maintained in the range from 2.7 to 26.6 kPa by the balance of continuous introduction of the plasma gas and evacuation. A microwave generator of 300 watts output with a magnetron was energized to generate microwaves of 2.45 GHz which were guided through an isolator, power motor, three-stab tuner and waveguide to a quartz glass reaction tube surrounding the base body of the scalpel so that plasma was generated to surround the base body. The output power of the microwave generator was adjusted so that the temperature of the base body could be maintained at about 930° C. After 20 minutes of the plasma treatment in this manner, the base body of the scalpel was taken out of the plasma chamber and examined to find that the surface of the base body was coated with a carbonaceous coating layer having a thickness of 15 to 18 nm as determined with an ellipsometer and having a crystalline structure of diamond.

In the next place, the thus coated base body of the scalpel was placed in another plasma chamber in such a disposition that the edge of the scalpel was just facing the gaseous stream in the chamber. After closing the chamber, the chamber was evacuated to have a reduced pressure of about 5 Pa and then hydrogen gas was introduced continuously into the chamber at a controlled rate so that the pressure inside the plasma chamber was maintained at about 10 Pa by the balance of the continuous introduction of hydrogen gas and evacuation. Thereafter, a high-frequancy generator of 200 watts output at a frequency of 13.56 MHz was energized to generate plasma in the hydrogen atmosphere under adjustment of the electric power so as to control the temperature of the base body at about 30° C. After 20 minutes of the plasma treatment for etching in this manner, the scalpel was taken out of the plasma chamber and examined for the surface condition to find that the surface had a roughness of up to 2 nm.

The thus diamond-coated and surface-roughened scalpel, referred to as the scalpel A hereinbelow, was subjected to the incisiveness test according to the procedure specified in JIS T 0201 to find a value of 1.1 ml. For comparison, the same incisiveness test was undertaken for a diamond-coated scalpel before the plasma-etching treatment and a scalpel before the plasma treatment for the deposition of a diamond-like coating layer, referred to as the scalpels B and C, respectively, hereinbelow, to find values of 4.0 ml and 7.0 ml, respectively.

A number of bovine primary embryos were cut and isolated by using one of these scalpels A, B and C and the isolated embryos were cultured in a standard culture medium at 37° C. to determine the percentage of survival in the culturing. The results for the percentages of survival were 73%, 62% and 31% with the scalpels A, B and C, respectively, after 8 days of culturing.

EXAMPLE 2

A ruby-made base body of a scalpel, after successive washing with water and isopropyl alcohol and drying, was placed in the same plasma chamber as used in the first step of Example 1. After closing the chamber, the chamber was evacuated to have a pressure of about 5 Pa and then a 5:95 by volume mixture of methane and hydrogen was introduced into the chamber at a controlled rate with concurrent evacuation so that the pressure inside the chamber was maintained in the range from 2.7 to 26.8 kPa by the balance of continuous introduction of the plasma gas and evacuation. A microwave generator of 350 watts output with a magnetron was energized to generate microwaves of 2.45 GHz which were guided through an isolator, power motor, three-stab tuner and waveguide to a quartz glass reaction tube surrounding the base body of the scalpel so that plasma was generated to surround the base body. The electric power of the microwave generator was adjusted so that the temperature of the base body could be maintained at about 1050° C. After 15 minutes of the plasma treatment in this manner, the base body was taken out of the plasma chamber and examined to find that the surface of the base bosy was coated with a carbonaceous coating layer having a thickness of 10 to 12 nm as determined with an ellipsometer and having a crystalline structure of diamond.

In the next place, the thus diamond-coated scalpel was subjected to a plasma-etching treatment in about the same manner as in Example 1. Thus, the scalpel was placed in another plasma chamber in a disposition similar to that in Example 1 and, after closing the chamber, the chamber was evacuated to have a reduced pressure of about 5 Pa and then hydrogen gas was introduced continuously into the chamber at a controlled rate so that the pressure inside the plasma chamber was maintained at about 10 Pa by the balance of the continuous introduction of hydrogen gas and evacuation. Thereafter, the high-frequancy generator of 200 watts output at a frequency of 13.56 MHz was energized to generate plasma in the hydrogen atmosphere under adjustment of the electric power so as to control the temperature of the scalpel base body at about 30° C. After 15 minutes of the plasma treatment for etching in this manner, the scalpel was taken out of the plasma chamber and examined for the surface condition to find that the surface had a roughness of up to 2.8 nm.

The thus diamond-coated and surface-roughened scalpel, referred to as the scalpel D hereinbelow, was subjected to the incisiveness test according to the procedure specified in JIS T 0201 to find a value of 1.8 ml. For comparison, the same incisiveness test was undertaken for a diamond-coated but unetched scalpel and a scalpel before the plasma treatment for the deposition of a diamond-like coating layer, referred to as the scalpels E and F, respectively, hereinbelow, to find values of 4.2 ml and 8.0 ml, respectively.

A number of bovine primary embryos were cut and isolated by using one of these scalpels D, E and F and the isolated embryos were cultured to determine the percentage of survival in the culturing. The results for the percentages of survival were 71%, 59% and 29% with the scalpels D, E and F, respectively, after 8 days of culturing.

EXAMPLE 3

A sapphire base body of a scalpel was subjected to the plasma treatment for the deposition of a carbonaceous coating layer thereon in about the same manner as in Example 2 except that the pressure inside the plasma chamber was controlled at 2.7 to 26.6 kPa, the temperature of the base body was maintained at 980° C. by adjusting the microwave output at about 330 watts and the plasma treatment was continued for 12 minutes. The base body of the scalpel taken out of the plasma chamber was examined to find that the surface thereof was provided with a carbonaceous coating layer having a thickness of 8 to 10 nm and having a crystalline structure of diamond.

In the next place, the thus coated base body of the scalpel was placed in another plasma chamber in such a disposition that the edge of the scalpel was just facing the gaseous stream in the chamber. After closing the chamber, the chamber was evacuated to have a reduced pressure of about 5 Pa and then hydrogen gas was introduced continuously into the chamber at a controlled rate so that the pressure inside the plasma chamber was maintained at about 5 to 20 Pa by the balance of the continuous introduction of hydrogen gas and evacuation. Thereafter, a high-frequency, generator of 200 watts output at a frequency of 13.56 MHz was energized to generate plasma in the hydrogen atmosphere under adjustment of the electric power so as to control the temperature of the base body of the scalpel at about 30° C. After 25 minutes of the plasma treatment for etching in this manner, the scalpel was taken out of the plasma chamber and examined for the surface condition to find that the surface had a roughness of up to 1.8 nm.

The thus diamond-coated and surface-roughened scalpel, referred to as the scalpel G hereinbelow, was subjected to the incisiveness test according to the procedure specified in JIS T 0201 to find a value of 1.0 ml. For comparison, the same incisiveness test was undertaken for a diamond-coated scalpel before the plasma-etching treatment and a scalpel before the plasma treatment for the deposition of a diamond-like coating layer, referred to as the scalpels H and I, respectively, hereinbelow, to find values of 3.9 ml and 7.5 ml, respectively.

A number of bovine primary embryos were cut and isolated by using one of these scalpels G, H and I and the isolated embryos were cultured to determine the percentage of survival in the culturing. The results for the percentages of survival were 76%, 60% and 29% with the scalpels G, H and I, respectively, after 8 days of culturing.

What is claimed is:

1. A method for the preparation of an edged medical tool which comprises the steps of:
    (a) exposing a base body of the edged medical tool, maintained at a temperature from 500° to 1300° C., to an atmosphere of a plasma generated in a gaseous mixture composed of hydrogen gas and a hydrocarbon gas by applying a high-frequency electric power at a frequency in the range from 1 GHz to 10 GHz to deposit a carbonaceous coating layer having an at least partially crystalline structure of diamond and a thickness in the range from 1 nm to 20 nm on the surface of the base body of the edged medical tool in a plasma-induced vapor-phase deposition process; and (b) exposing the coated base body of the edged medical tool to an atmosphere of a plasma generated in hydrogen gas by applying a high-frequency electric power at a frequency of 1 MHz or higher to effect etching of the surface of the at least partially crystalline carbonaceous coating layer to such an extent that the surface has a surface roughness in the range from 0.5 nm to 5 nm.

2. The method as claimed in claim 1 wherein the frequency of the high frequency electric power in step (b) is in the range from 5 MHz to 100 MHz.

3. The method as claimed in claim 1 wherein the pressure of the hydrogen gas in step (b) is in the range from 5 Pa to 20 Pa.

4. The method as claimed in claim 1 wherein the coated base body in step (b) is kept at a temperature in the range from 20° C. to 50° C.

* * * * *